United States Patent
Tsutsumi et al.

(10) Patent No.: US 9,887,343 B2
(45) Date of Patent: Feb. 6, 2018

(54) ACOUSTIC WAVE ELEMENT

(71) Applicant: TAIYO YUDEN CO., LTD., Tokyo (JP)

(72) Inventors: Jun Tsutsumi, Tokyo (JP); Masafumi Iwaki, Tokyo (JP); Kentaro Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 402 days.

(21) Appl. No.: 14/555,125

(22) Filed: Nov. 26, 2014

(65) Prior Publication Data

US 2015/0155851 A1 Jun. 4, 2015

(30) Foreign Application Priority Data

Nov. 29, 2013 (JP) ................................. 2013-248700

(51) Int. Cl.
*H03H 9/25* (2006.01)
*H01L 41/047* (2006.01)
*H03H 9/02* (2006.01)

(52) U.S. Cl.
CPC ....... *H01L 41/047* (2013.01); *H03H 9/02559* (2013.01); *H03H 9/02669* (2013.01)

(58) Field of Classification Search
CPC .............. H01L 41/047; H03H 9/02559; H03H 9/02669; H03H 9/02574
USPC .......................................... 310/313 B, 313 A
See application file for complete search history.

(56) References Cited

U.S. PATENT DOCUMENTS

| | | | |
|---|---|---|---|
| 5,684,437 A | | 11/1997 | Ago et al. |
| 5,838,217 A | * | 11/1998 | Kadota .............. H03H 9/02669 310/313 B |
| 5,977,686 A | * | 11/1999 | Kadota ................ H03H 9/6463 310/313 B |
| 5,986,523 A | | 11/1999 | Morozumi et al. |
| 6,127,769 A | * | 10/2000 | Kadota .............. H03H 9/02669 310/313 B |

(Continued)

FOREIGN PATENT DOCUMENTS

| JP | 7-263998 A | 10/1995 |
|---|---|---|
| JP | 09-252231 A | 9/1997 |

(Continued)

OTHER PUBLICATIONS

Japanese Office Action dated Oct. 3, 2017, in a counterpart Japanese patent application No. 2013-248700. (A machine translation (not reviewed for accuracy) attached.)

*Primary Examiner* — Shawki S Ismail
*Assistant Examiner* — Bryan Gordon
(74) *Attorney, Agent, or Firm* — Chen Yoshimura LLP

(57) ABSTRACT

An acoustic wave element includes: a piezoelectric substrate; an IDT (Interdigital Transducer) formed on the piezoelectric substrate; and an end face of the piezoelectric substrate that is formed on at least one end of the IDT in a propagation direction of an acoustic wave; wherein when a wavelength of the acoustic wave which the IDT excites is expressed by "λ" and a metallization ratio of the IDT is expressed by "D", a distance between an inner end of an electrode finger of the IDT nearest to the end face and the end face is equal to or more than 7λ/16+D×λ/4 and equal to or less than 3λ/4+D×λ/4.

11 Claims, 10 Drawing Sheets

(56) References Cited

U.S. PATENT DOCUMENTS

| | | | | |
|---|---|---|---|---|
| 6,297,713 | B1* | 10/2001 | Kadota | H03H 9/0038 |
| | | | | 310/313 B |
| 6,377,139 | B1 | 4/2002 | Horiuchi et al. | |
| 6,806,619 | B2* | 10/2004 | Nakamura | H03H 9/0042 |
| | | | | 310/313 A |
| 2002/0130736 | A1* | 9/2002 | Mukai | H03H 9/02669 |
| | | | | 333/193 |
| 2005/0093660 | A1* | 5/2005 | Wada | H03H 9/02779 |
| | | | | 333/196 |
| 2008/0067891 | A1* | 3/2008 | Matsuda | H03H 9/0057 |
| | | | | 310/313 R |
| 2013/0200960 | A1* | 8/2013 | Sauer | H03H 3/10 |
| | | | | 333/133 |
| 2014/0009032 | A1* | 1/2014 | Takahashi | H01L 41/29 |
| | | | | 310/313 B |

FOREIGN PATENT DOCUMENTS

| | | |
|---|---|---|
| JP | 2000-59175 A | 2/2000 |
| JP | 2000-278091 A | 10/2000 |
| JP | 2001-94374 A | 4/2001 |
| JP | 2001-339271 A | 12/2001 |
| JP | 2002-368576 A | 12/2002 |
| JP | 2007-20234 A | 1/2007 |

* cited by examiner

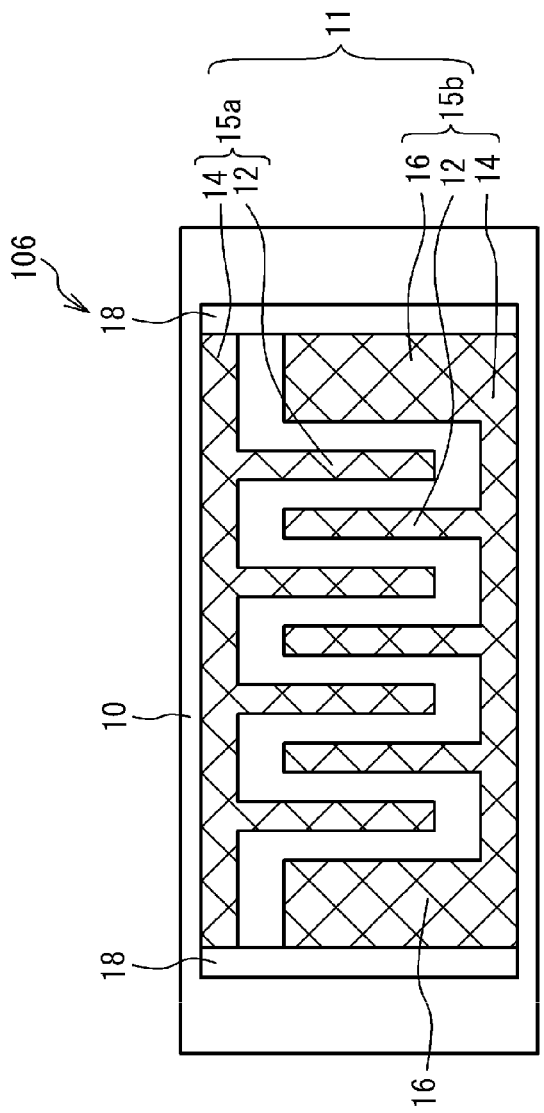
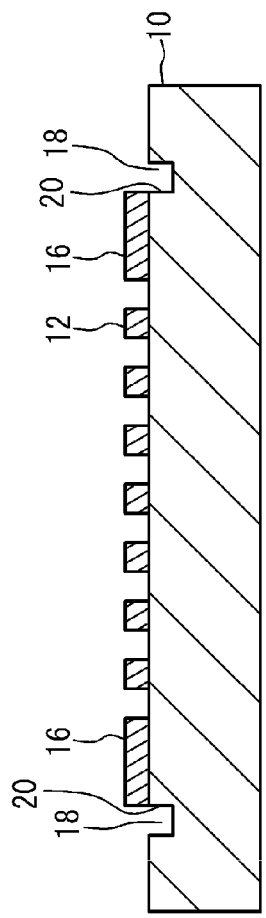

ACOUSTIC WAVE ELEMENT

CROSS-REFERENCE TO RELATED APPLICATION

This application is based upon and claims the benefit of priority of the prior Japanese Patent Application No. 2013-248700, filed on Nov. 29, 2013, the entire contents of which are incorporated herein by reference.

FIELD

A certain aspect of the present invention relates to an acoustic wave element, e.g. to an acoustic wave element having an IDT.

BACKGROUND

An acoustic wave element is used for a filter and a duplexer used for a mobile communication apparatus. A surface acoustic wave element, a boundary acoustic wave element or a love wave element is used as such an acoustic wave element. The acoustic wave element includes an IDT (Interdigital Transducer) formed on a piezoelectric substrate. An edge reflection type acoustic wave element that reflects an acoustic wave excited by the IDT by using an end face is disclosed in documents (e.g. Japanese Patent Application Publication Nos. 7-263998, 2000-59175, 2001-339271, 2001-94374, 2002-368576 and 2007-20234).

In the edge reflection type acoustic wave element, a reflector is unnecessary and downsizing of the acoustic wave element is possible, compared with an acoustic wave element that reflects the acoustic wave excited by the IDT by using the reflector. Moreover, by controlling a bulk wave which occurs between the IDT and the reflector, low loss becomes possible.

However, in the edge reflection type acoustic wave element, a width of an electrode finger nearest to each of end faces is set to one half of the widths of other electrode fingers. When a frequency of a signal which excites the acoustic wave becomes high, the widths of the electrode fingers become narrow. Thus, in order to form the narrow electrode fingers, it becomes difficult to manufacture the acoustic wave element cheaply and easily.

SUMMARY OF THE INVENTION

According to an aspect of the present invention, there is provided an acoustic wave element including: a piezoelectric substrate; an IDT (Interdigital Transducer) formed on the piezoelectric substrate; and an end face of the piezoelectric substrate that is formed on at least one end of the IDT in a propagation direction of an acoustic wave; wherein when a wavelength of the acoustic wave which the IDT excites is expressed by "$\lambda$" and a metallization ratio of the IDT is expressed by "D", a distance between an inner end of an electrode finger of the IDT nearest to the end face and the end face is equal to or more than $7\lambda/16+D\times\lambda/4$ and equal to or less than $3\lambda/4+D\times\lambda/4$.

According to another aspect of the present invention, there is provided an acoustic wave element including: a piezoelectric substrate; an IDT (Interdigital Transducer) formed on the piezoelectric substrate; and an end face of the piezoelectric substrate that is formed on at least one end of the IDT in a propagation direction of an acoustic wave; wherein when a wavelength of the acoustic wave which the IDT excites is expressed by "$\lambda$" and a metallization ratio of the IDT is expressed by "D", a distance between an inner end of an electrode finger of the IDT nearest to the end face and the end face is equal to or less than $\lambda/4+D\times\lambda/4$, and a width of the electrode finger of the IDT nearest to the end face is more than $D\times\lambda/4$.

BRIEF DESCRIPTION OF THE DRAWINGS

FIG. 10A is a plain view of an acoustic wave element according to a fourth embodiment; and FIG. 10B is a cross-sectional view taken along a line A-A in FIG. 10A.

DETAILED DESCRIPTION

Figure 1:
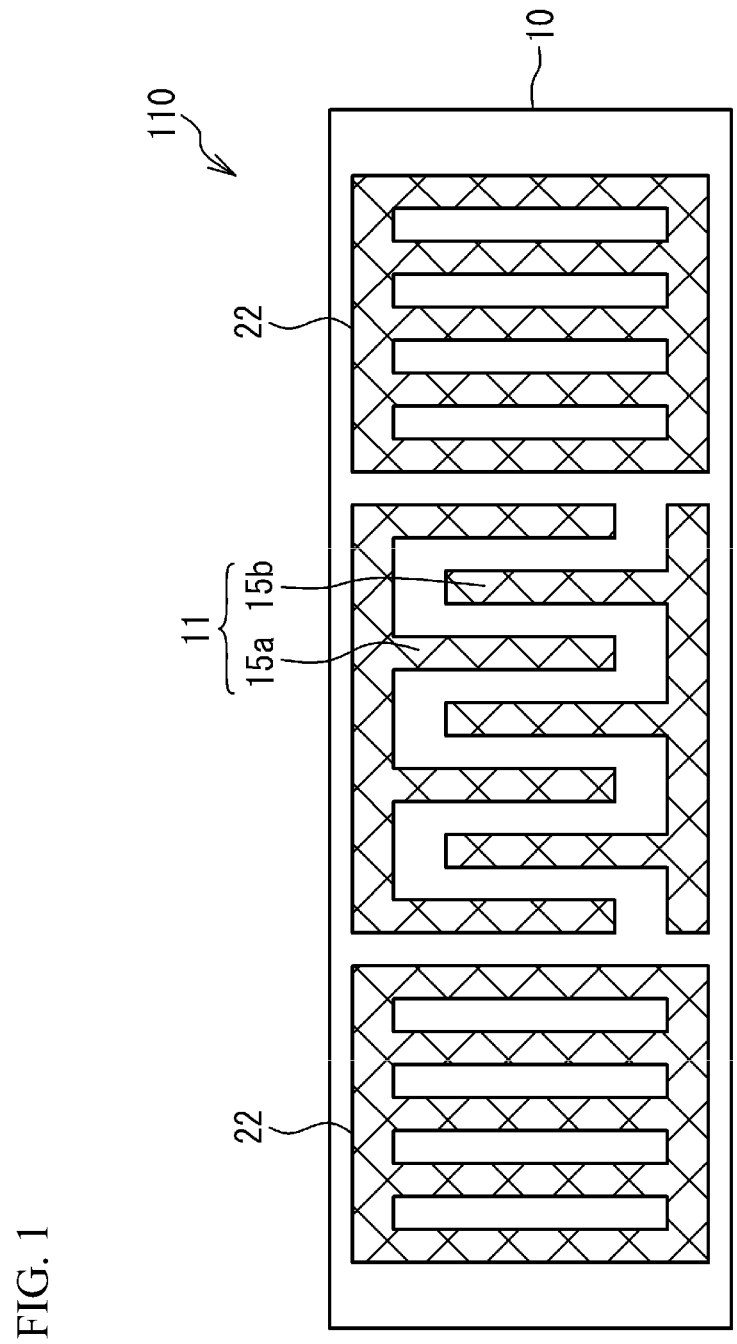
FIG. 1 is a plain view of an acoustic wave element according to a comparative example 1.

First, a description will be given of an acoustic wave element having a reflector, as a comparative example 1. FIG. 1 is a plain view of the acoustic wave element according to the comparative example 1. In an acoustic wave element 110 according to the comparative example 1, an IDT 11 and reflectors 22 are formed on a piezoelectric substrate 10, as illustrated in FIG. 1. The IDT 11 includes interdigital electrodes 15a and 15b. The reflectors 22 are provided on both sides of a propagation direction of an acoustic wave which the IDT 11 has excited, and the reflectors 22 reflect the acoustic wave which the IDT 11 has excited. Each of the reflectors 22 is a grating reflector which has 20 or more electrode fingers, for example. In the comparative example 1, the downsizing of the acoustic wave element is difficult because of spaces for the reflectors 22. A bulk wave is emitted between the IDT 11 and the reflectors 22.

Figure 2A:
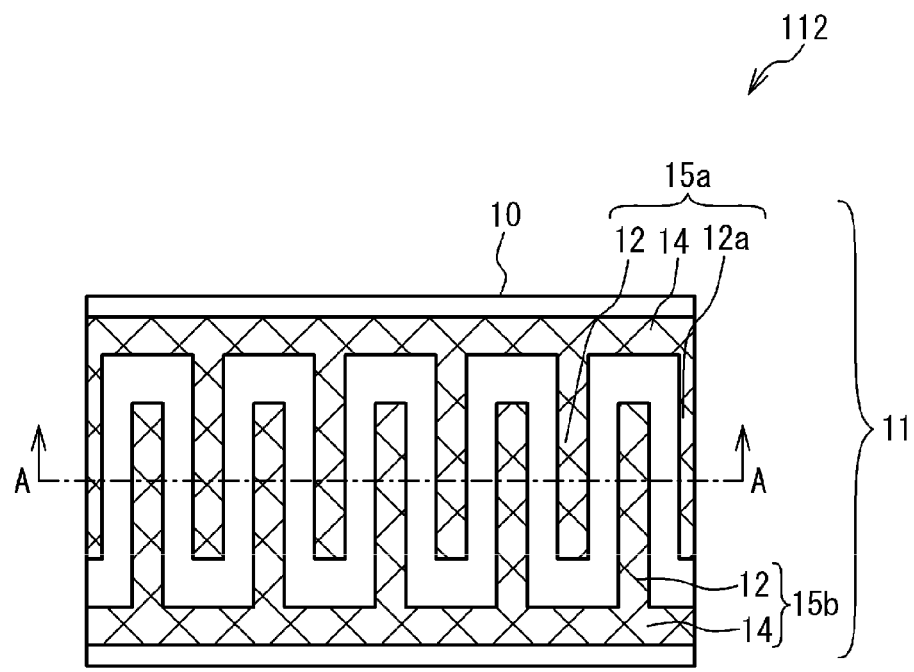
FIG. 2A is a plain view of an acoustic wave element according to a comparative example 2.
Figure 2B:
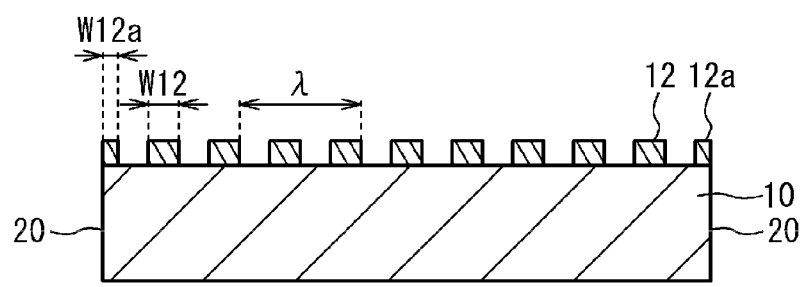
FIG. 2B is a cross-sectional view taken along a line A-A in FIG. 2A.

Next, a description will be given of an edge reflection type acoustic wave element, as a comparative example 2. FIG. 2A is a plain view of the acoustic wave element according to the comparative example 2. FIG. 2B is a cross-sectional view taken along a line A-A in FIG. 2A. In the acoustic wave element 112, the IDT 11 is formed on the piezoelectric substrate 10, as illustrated in FIGS. 2A and 2B. The IDT 11 includes two interdigital electrodes 15a and 15b which are opposite to each other. The interdigital electrode 15a includes electrode fingers 12 and 12a and a bus bar 14. The interdigital electrode 15b includes the electrode fingers 12 and the bus bar 14. End faces 20 are formed on the piezoelectric substrate 10. The electrode fingers nearest to the end faces 20 are electrode fingers 12a. A pitch of the electrode fingers 12 corresponds to a wavelength λ of the acoustic wave which the electrode fingers 12 excite. A width W12 of each electrode finger 12 is λ/4, and a width W12a of each electrode finger 12a is λ/8.

Each of the electrode fingers 12 excites the acoustic wave. The acoustic wave propagates in a direction in which the electrode fingers 12 arrange. The propagated acoustic wave reflects at the end faces 20. At this time, by making the width W12a into λ/8, the acoustic wave can be efficiently reflected by the end faces 20.

In the comparative example 2, the reflectors 22 become unnecessary, compared with the comparative example 1. For this reason, the downsizing of the acoustic wave element is possible. Moreover, the radiation of the bulk wave between the IDT 11 and the reflectors 22 is controlled, and a loss can be improved.

However, when a signal whose frequency is 2 GHz is handled, λ is about 2 μm. Therefore, the width W12a is 0.25 μm. When a frequency of a signal is 1 GHz, λ is about 4 μm and the width W12a is 0.5 μm. Thus, when the width W12a is small, a fabrication process of the electrode fingers 12a becomes expensive and complicated.

Next, a description will be given of a comparative example 3 in which the electrode fingers 12a are deleted. Deleting the electrode fingers 12a is described in Japanese Patent Application Publication No. 7-263998. Therefore, the applicant has considered an acoustic wave element according to the comparative example 3 in which the electrode fingers 12a have been deleted. When the electrode fingers 12a are not formed, patterns narrower than the electrode fingers 12 are lost, and the fabrication process of the electrode fingers becomes cheap and easy.

Q-values of the acoustic wave element according to the comparative examples 2 and 3 are calculated by using a 42° rotated Y-cut LiTaO$_3$ substrate (i.e., 42° rotated Y-axis cut X-direction propagation LiTaO$_3$ substrate) as the piezoelectric substrate 10.

Figure 3:
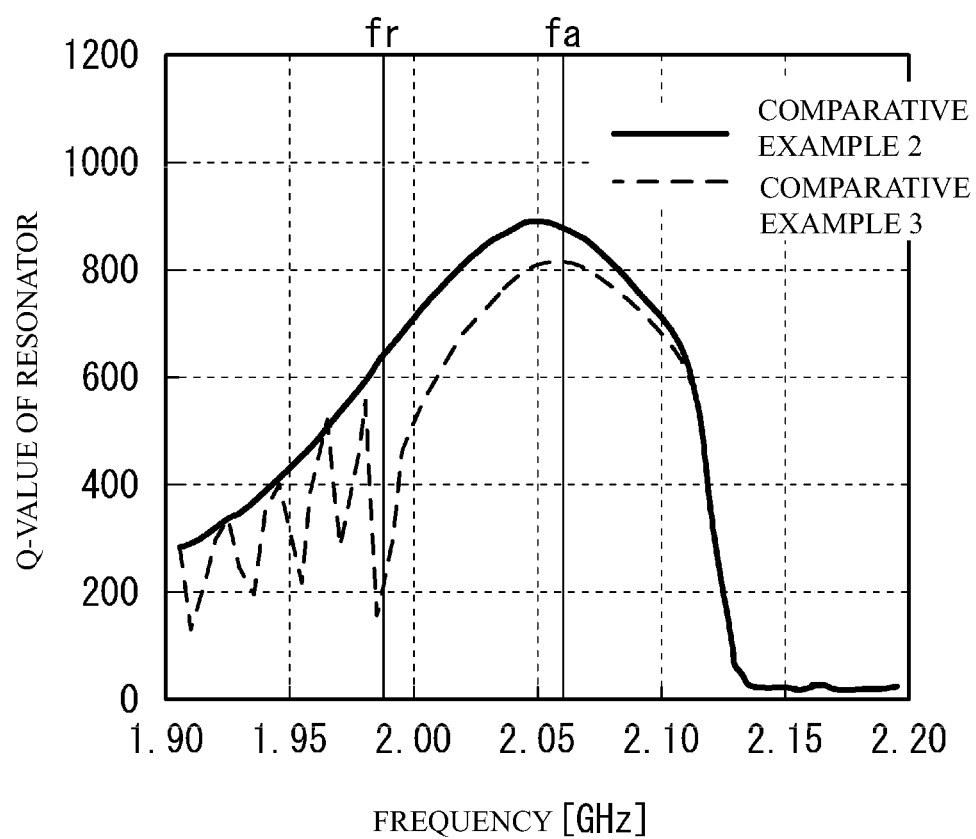
FIG. 3 is a diagram illustrating Q-values of resonators to frequencies in the acoustic wave elements according to comparative examples 2 and 3.

FIG. 3 is a diagram illustrating the Q values of resonators to frequencies in the acoustic wave elements according to the comparative examples 2 and 3. A solid line indicates the comparative example 2, and a dotted line indicates the comparative example 3. A code "fr" indicates a resonant frequency and a code "fa" indicates an anti-resonant frequency. As illustrated in FIG. 3, the comparative example 3 has low a Q-value, compared with the comparative example 2. Especially, in a frequency below the anti-resonant frequency, the Q-value of the comparative example 3 is low. When the electrode fingers 12a are not formed, it is understood that the Q-value deteriorates.

Hereinafter, a description will be given of an embodiment of the acoustic wave element in which a performance, such as the Q-value, does not deteriorate and which can be manufactured cheaply and easily.

(First Embodiment)

Figure 4A:
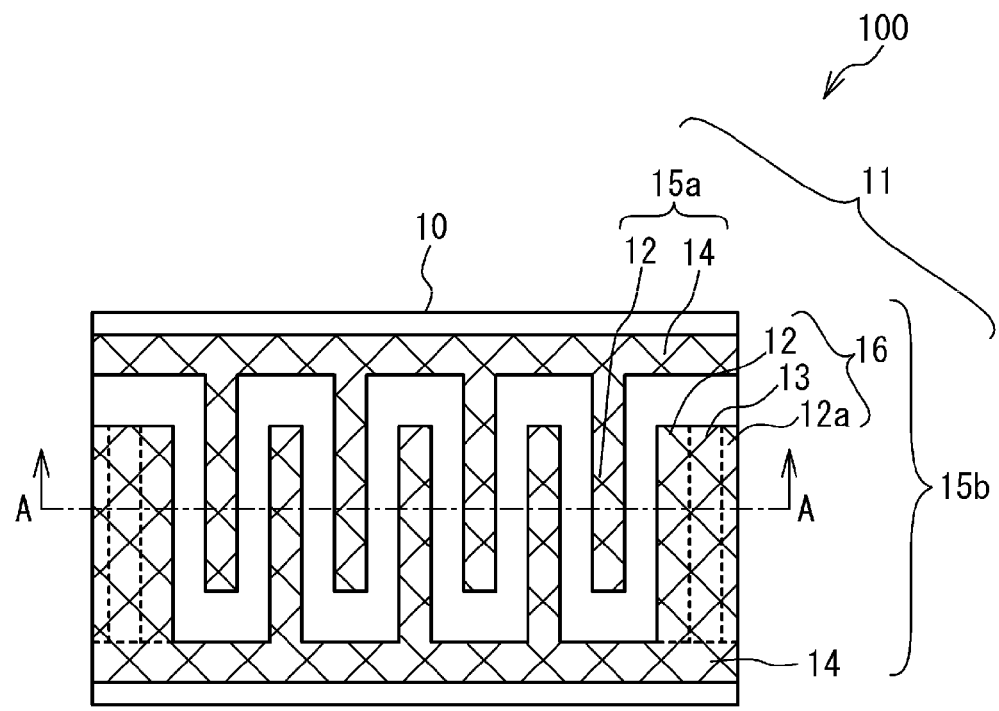
FIG. 4A is a plain view of an acoustic wave element according to a first embodiment.
Figure 4B:
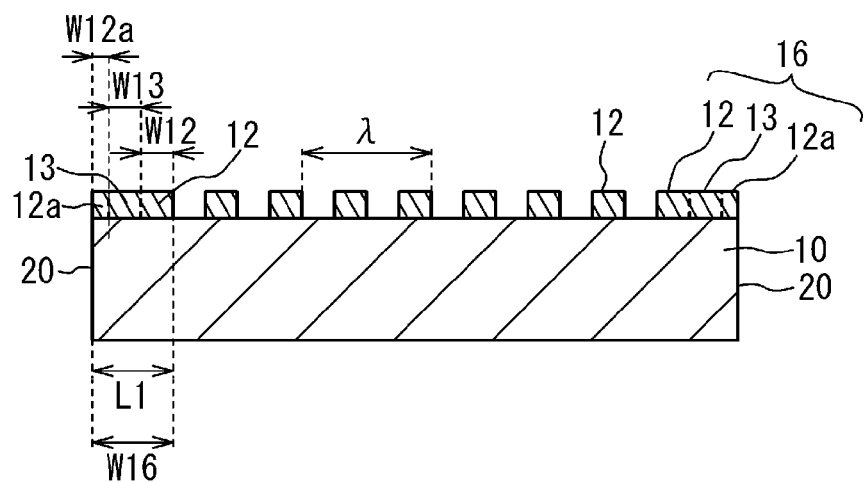
FIG. 4B is a cross-sectional view taken along a line A-A in FIG. 4A.

FIG. 4A is a plain view of an acoustic wave element according to a first embodiment, and FIG. 4B is a cross-sectional view taken along a line A-A in FIG. 4A. As illustrated in FIGS. 4A and 4B, in an acoustic wave element 100, the IDT 11 is formed on the piezoelectric substrate 10. The piezoelectric substrate 10 is a LiTaO$_3$ substrate or a LiNbO$_3$ substrate, for example. The IDT 11 excites the acoustic wave which mainly uses a SH vibration as an ingredient. The IDT 11 is a metallic film which makes Al (aluminum) or Cu (copper) a main ingredient, for example. The IDT 11 has the interdigital electrodes 15a and 15b. The interdigital electrode 15a includes the plurality of electrode fingers 12 and the bus bar 14. The electrode fingers 12 are arranged in a propagation direction of the acoustic wave which the electrode fingers 12 excite, and the electrode fingers 12 extend in a direction which intersects perpendicularly with the propagation direction of the acoustic wave. The interdigital electrode 15b includes the electrode fingers 12, electrode fingers 16 and the bus bar 14. The electrode fingers 12 and 16 are arranged in a propagation direction of the acoustic wave which the electrode fingers 12 excite, and the electrode fingers 12 and 16 extend in a direction which intersects perpendicularly with the propagation direction of the acoustic wave. In a filter for a high frequency signal, the electrode fingers 12 of the interdigital electrode 15a and 15b are formed alternately. Moreover, a pair number of each of the electrode fingers 12 is omitted from an original number.

Each of the electrode fingers 16 is an electrode finger nearest to the end face 20. Each of the electrode finger 16 connects the electrode finger 12a of the interdigital electrode 15a according to the comparative example 2 to the interdigital electrode 15b, and sets the electrode finger 12 which adjoins the electrode finger 12a to a same electrical potential. A metallic layer 13 which is the same electric potential as the electrode fingers 12a and 12 is provided between the electrode fingers 12a and 12 of the interdigital electrode 15b. Thereby, in the end face 20, the acoustic wave is reflected to the same extent as the comparative example 2. It is desirable that the end face 20 is about 90 degrees against an upper surface of the piezoelectric substrate 10 in order to control the loss of the acoustic wave.

It is assumed that the widths of the electrode finger 12, the metallic layer 13 and the electrode finger 12a are W12, W13 and W12a, respectively. It is assumed that a metallization ratio of the electrode finger 12 is "D". The metallization ratio D is an index which indicates a ratio of the electrode finger 12 in the propagation direction of the acoustic wave. The metallization ratio D is indicated as "D=(W12/(λ/2))=(W12×2)/λ". For example, in the case of D=0.5, the width of the electrode finger 12 is equal to a width of a space between the electrode fingers 12.

The widths are indicated as "W12=D×λ/2, W13=(1−D)×λ/2, and W12a=D×λ/4". A distance from an inner side of the electrode finger 16 to the end face 20 is set to L1. When an outer side surface of the electrode finger 16 and the end face 20 are in the same plane, a width W16 of the electrode finger 16 and the distance L1 are almost equal. Therefore, the distance L1 becomes "L1=W12+W13+W12a=λ/2+D=λ/4". This distance L1 is set as a reference distance L0. That is, the reference distance L0 is indicated as "L0=λ/2+D×λ/4".

The simulation of the Q-values of the acoustic wave elements according to the comparative example 2 and the first embodiment was carried out using a finite element method. In the simulation, the piezoelectric substrate 10 is the 42° rotated Y-cut LiTaO$_3$ substrate, the IDT 11 is an Al film, λ is set to 2 μm, D is set to 0.5, and L1 is set to 5λ/8.

Figure 5:
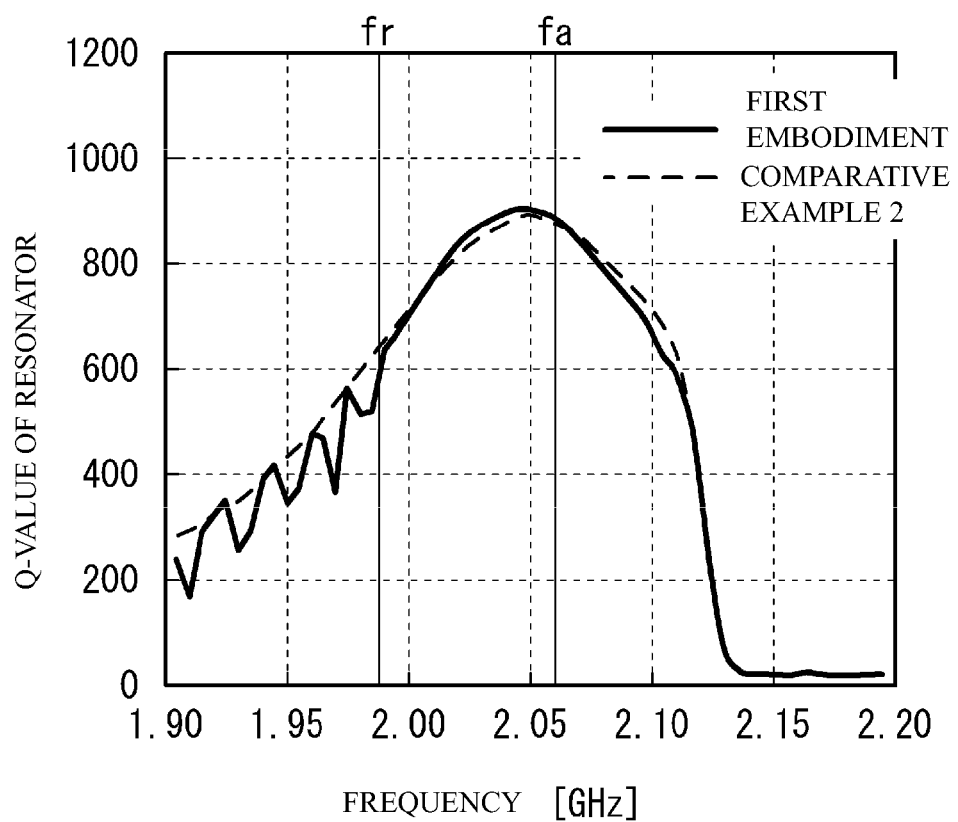
FIG. 5 is a diagram illustrating Q-values of resonators to frequencies in the acoustic wave elements according to the comparative example 2 and the first embodiment.

FIG. 5 is a diagram illustrating Q-values of resonators to frequencies in the acoustic wave elements according to the comparative example 2 and the first embodiment. A solid line indicates the first embodiment, and a dotted line indicates the comparative example 2. As illustrated in FIG. 5, the O-value of the first embodiment is equal to or more than that of the comparative example 2. Especially, in the frequency between the resonance frequency "fr" and the anti-resonant frequency "fa", the Q-value of the first embodiment is more than that of the comparative example 2.

Figure 6A:
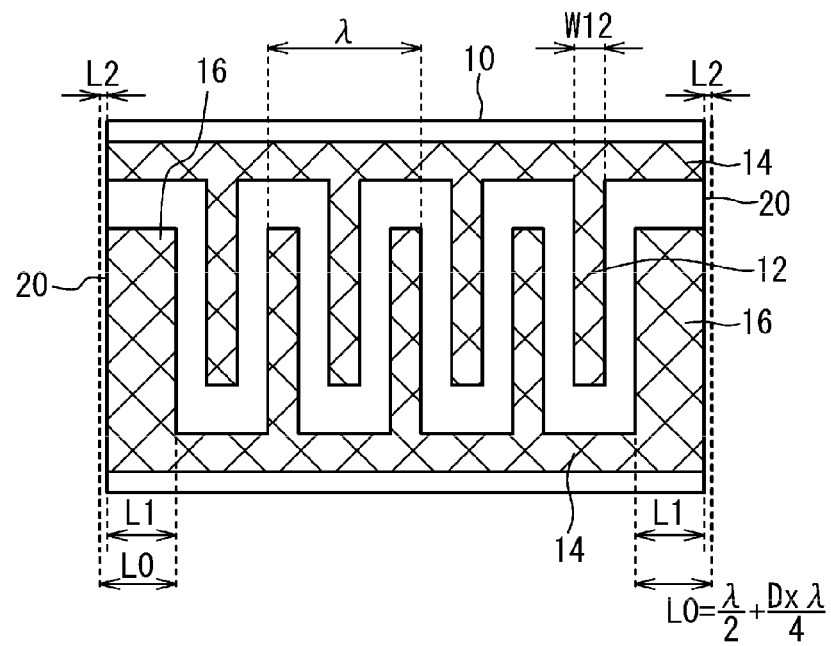
FIGS. 6A and 6B are plain views of the acoustic wave element when the positions of end faces are changed.
Figure 6B:
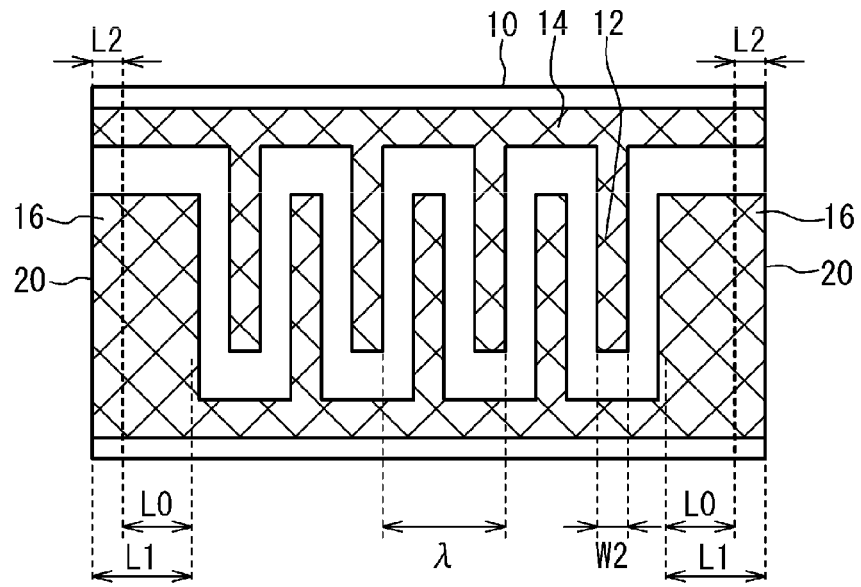

Next, the positions of the end faces 20 are changed. FIGS. 6A and 6B are plain views of the acoustic wave element when the positions of end faces are changed. As illustrated in FIG. 6A, the distance L1 from the inner end of the electrode finger 16 to the end face 20 is shorter than the reference distance L0. At this time, a distance L2 (=L1−L0) which subtracts the distance L1 from the reference distance L0 becomes negative. As illustrated in FIG. 6B, the distance L1 from the inner end of the electrode finger 16 to the end face 20 is longer than the reference distance L0. The distance L2 (=L1−L0) which subtracts the distance L1 from the reference distance L0 becomes positive.

Figure 7:
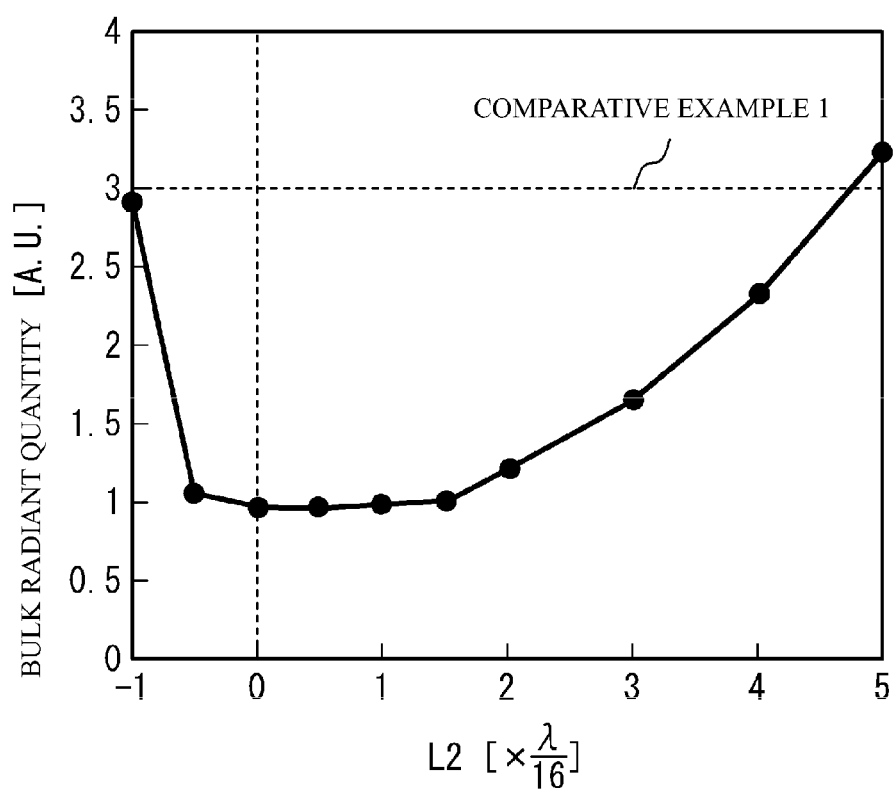
FIG. 7 is a diagram illustrating a bulk radiant quantity to a distance L2 according to the first embodiment.

FIG. 7 is a diagram illustrating a simulation result of a bulk radiant quantity from the end faces 20 when the distance L2 according to the first embodiment is made to change for each $0.5\lambda/16$. FIG. 7 indicates that the loss becomes large as the bulk radiant quantity increases. In the simulation, the piezoelectric substrate 10 is the 42° rotated Y-cut $LiTaO_3$ substrate, the IDT 11 is an Al film, $\lambda$ is set to 2 μm, D is set to 0.5, and L1 is set to $5\lambda/8$.

The dots in FIG. 7 indicate calculation results, and a solid line in FIG. 7 is a line connecting dots to each other. For comparison, the acoustic wave element which has the reflector without using the end faces 20 is made into the comparative example 1. A dotted line indicates a simulation result of the comparative example 1. The bulk radiant quantity is indicated by an arbitrary unit.

When the distance L2 is from $-0.5\lambda/16$ to $\lambda/16$, the bulk radiant quantity becomes a bottom value, as illustrated in FIG. 7. When the distance L2 becomes smaller than $-0.5\lambda/16$, the bulk radiant quantity increases rapidly. When the distance L2 becomes larger than $2\lambda/16$, the bulk radiant quantity increases slowly. When the distance L2 is from $-1\lambda/16$ to $4\lambda/16$, the bulk radiant quantity becomes smaller than the bulk radiant quantity of the comparative example 1 having the reflector. When the distance L2 is equal to or more than $-1\lambda/16$ and equal to or less than $4\lambda/16$, a central distance L2 is $1.5\lambda/16$.

When the metallization ratio D of the electrode finger 12 is taken into consideration, the reference distance L0 is indicated as "$L0=\lambda/2+D\times\lambda/4$". Therefore, a desirable range of the distance L1 (=L0+L2) from the inner end of the electrode finger 16 to the end face 20 is equal to or more than $7\lambda/16+D\times\lambda/4 (=\lambda/2+D\lambda/4-1\lambda/16)$ and is equal to or less than $3\lambda/4+D\times\lambda/4(=\lambda/2+D\times\lambda/4+4\lambda/16)$.

As described above, according to the first embodiment, each of the electrode fingers 12a of the IDT 11 nearest to each of the end faces 20 is the same electrical potential as the adjoining electrode finger 12, and the metallic layer 13 which is the same electrical potential as the electrode finger 12a and the adjoining electrode finger 12 is provided between the electrode finger 12a and the adjoining electrode finger 12. Thus, the electrode finger 16 having a wide width is formed by the electrode fingers 12a and 12 and the metallic layer 13. Therefore, the process of the electrode finger becomes easy, and the acoustic wave element can be manufactured cheaply and easily.

If the electrode finger 16 is used as the electrode finger of the IDT 11 nearest to the end face 20, the distance L1 between the inner end of the electrode finger 16 and the end face 20 is made into $7\lambda/16+D\times\lambda/4$ or more and $3\lambda/4+D\times\lambda/4$ or less, as illustrated in FIG. 7. Thereby, the bulk radiant quantity can be made into the comparative example 1 or less (the acoustic wave element using the reflector). That is, the loss can be made into the comparative example 1 or less.

Therefore, the performance of the acoustic wave element can be improved and the acoustic wave element can be manufactured cheaply and easily. It is desirable that the distance L1 is equal to or more than $7.5\lambda/16+D\times\lambda/4$. It is more desirable that the distance L1 is equal to or more than $8\lambda/16+D\times\lambda/4$. It is desirable that the distance L1 is equal to or less than $11.5\lambda/16+D\times\lambda/4$. It is more desirable that the distance L1 is equal to or less than $11\lambda/16+D\times\lambda/4$.

(Second Embodiment)

Figure 8A:
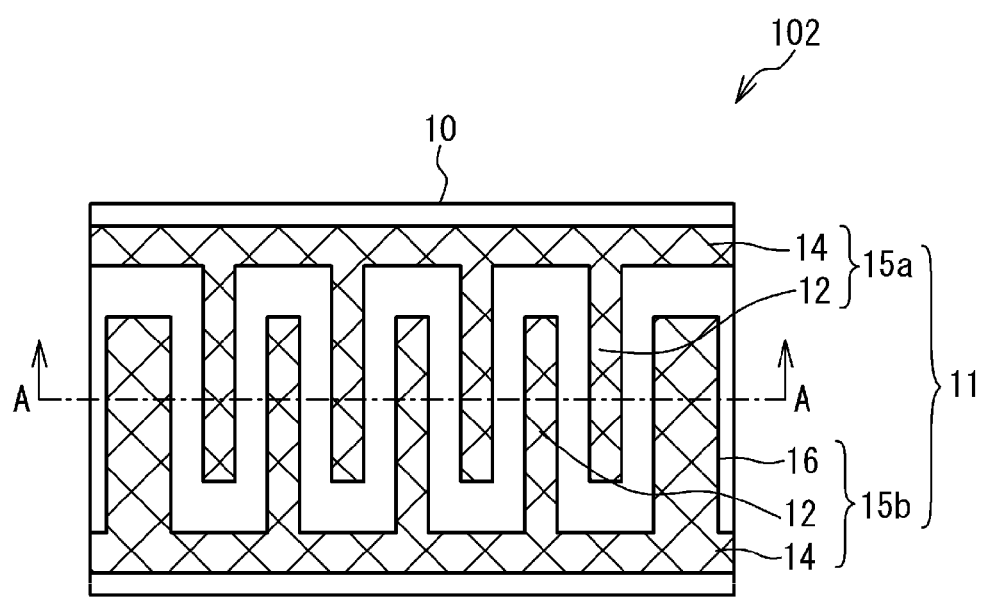
FIG. 8A is a plain view of an acoustic wave element according to a second embodiment.
Figure 8B:
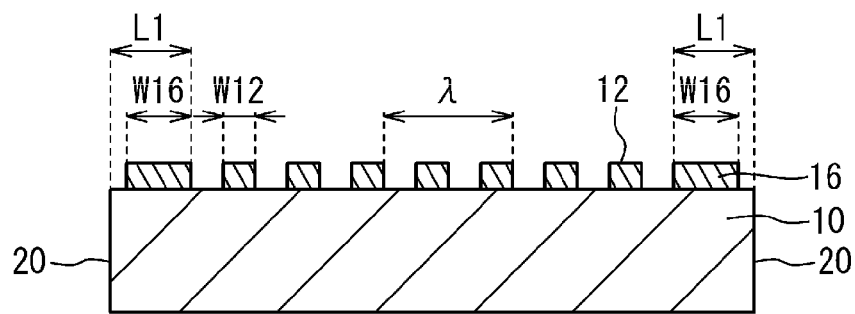
FIG. 8B is a cross-sectional view taken along a line A-A in FIG. 8A.

FIG. 8A is a plain view of an acoustic wave element according to a second embodiment. FIG. 8B is a cross-sectional view taken along a line A-A in FIG. 8A. In an acoustic wave element 102, side surfaces of the electrode fingers 16 near the end faces 20 may be separated from the end faces 20, as illustrated in FIGS. 8A and 8B. Since the other configurations of the acoustic wave element 102 are the same as those of the acoustic wave element 100 of the first embodiment, a description thereof is omitted.

According to the second embodiment, the distance L1 is made into $7\lambda/16+D\times\lambda/4$ or more and $3\lambda/4+D\lambda/4$ or less, as with the first embodiment. Thereby, the bulk radiant quantity can be smaller than the bulk radiant quantity of the comparative example 1, as with FIG. 7. Therefore, the loss can be controlled. Moreover, the width W16 of the electrode finger 16 is made larger than the width W12 (=$D\times\lambda/4$) of the electrode finger 12. Thereby, the acoustic wave element can be manufactured cheaply and easily.

As described in the first embodiment, the outer side surface of the electrode finger 16 and the end face 20 may be in the same plane. As described in the second embodiment, a side surface of the electrode finger 16 near the end face 20 may be separated from the end face 20.

(Third Embodiment)

Figure 9A:
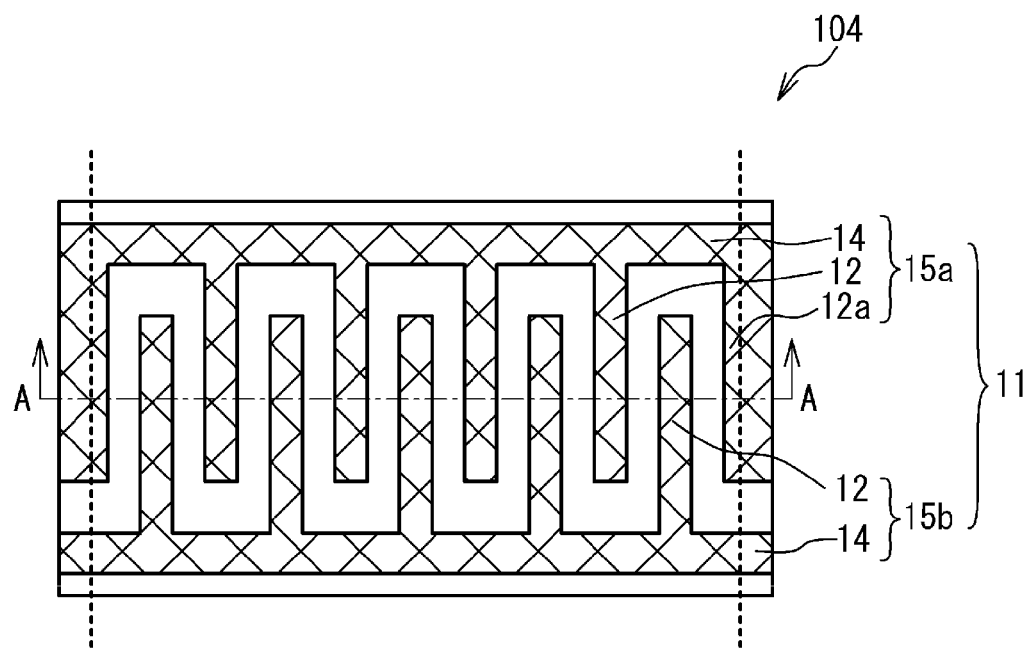
FIG. 9A is a plain view of an acoustic wave element according to a third embodiment.
Figure 9B:
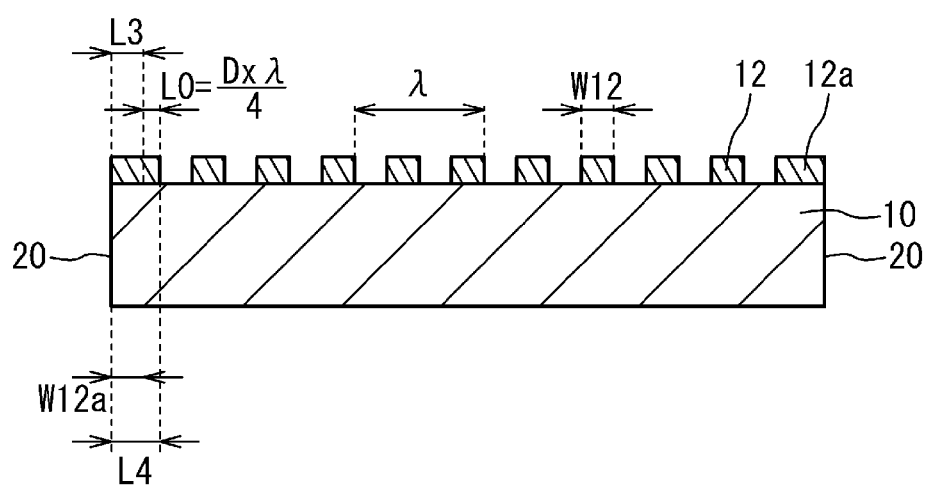
FIG. 9B is a cross-sectional view taken along a line A-A in FIG. 9A.

FIG. 9A is a plain view of an acoustic wave element according to a third embodiment. FIG. 9B is a cross-sectional view taken along a line A-A in FIG. 9A. In an acoustic wave element 104, the width W12a of each of the electrode fingers 12a becomes larger than the width "$D\times\lambda/4$" of the electrode fingers 12a of the comparative example 1, as illustrated in FIGS. 9A and 9B. Since the other configurations of the acoustic wave element 104 are the same as those of the acoustic wave element 100 of the first embodiment, a description thereof is omitted.

The simulation result of FIG. 7 is realized also when a criterion is made into the comparative example 1. That is, when the reference distance L0 is made into $D\times\lambda/4$, a distance L4 between an inner side surface of each of the electrode fingers 12a and each of the end faces 20 is indicated by "L4=L0+L3". At this time, the range of the distance L2 of FIG. 7 is applied to a distance L3, and the distance L3 is made into $-1\lambda/16$ or more and $4\lambda/16$ or less. Thereby, the bulk radiant quantity can be controlled.

When the width W12a of each of the electrode fingers 12a is equal to less than $D\times\lambda/4$, the process of the electrode fingers 12a becomes more difficult than the comparative example 1. Therefore, it is desirable that the width W12a is more than $D\times\lambda/4$. Moreover, it is desirable that the width W12a is equal to or more than the width W12 (=$D\times\lambda/2$) of each of the electrode fingers 12.

According to the third embodiment, the distance L4 between the inner end of each of the electrode fingers 12a and each of the end faces 20 is equal to or less than $\lambda/4+D\times\lambda/4$, and the width of each of the electrode fingers 12a is more than $D\times\lambda/4$. Thereby, the bulk radiant quantity can be made into the comparative example 3 or less. Moreover, since the width of each of the electrode fingers 12a can be enlarged, the performance of the acoustic wave element can be improved and the acoustic wave element can be manufactured cheaply and easily. It is desirable that the distance L4 is equal to or less than $3.5\lambda/16+D\times\lambda/4$. It is more desirable that the distance L4 is equal to or less than $3\lambda/16+D\times\lambda/4$. It is desirable that the width W12a is equal to or more than $5D\times\lambda/16$. It is more desirable that the width W12a is equal to or more than $D\times\lambda/2$.

(Fourth Embodiment)

FIG. 10A is a plain view of an acoustic wave element according to a fourth embodiment. FIG. 10B is a cross-sectional view taken along a line A-A in FIG. 10A. In an acoustic wave element 106, grooves 18 are formed on the piezoelectric substrate 10, as illustrated in FIGS. 10A and 10B. The grooves 18 are formed along the electrode fingers 16. The grooves 18 are formed by using a dry etching method, for example. One side surface of each of the grooves 18 can be used as the end face 20. Since the end face 20 reflects the acoustic wave, it is desirable that a depth of each of the grooves 18 is equal to or more than $\lambda$, and it is more desirable that the depth of each of the grooves 18 is equal to or more than $2\lambda$. Since the other configurations of the acoustic wave element 106 are the same as those of the acoustic wave element 100 of the first embodiment, a description thereof is omitted.

According to the fourth embodiment, the end face 20 is the side surface of each of the grooves 18 formed on the piezoelectric substrate 10. Thereby, the end face 20 can be formed easily. Moreover, a plurality of acoustic wave elements can be formed on the single piezoelectric substrate 10. By using the dry etching method in order to form the grooves 18, the end face 20 can be formed with high positional accuracy.

Also in the second and the third embodiments, the end face 20 can be made into the side surface of each of the grooves 18 formed on the piezoelectric substrate 10.

In the first to the fourth embodiments, the 42° rotated Y-cut LiTaO$_3$ substrate (i.e., the 42° rotated Y-axis cut X-direction propagation LiTaO$_3$ substrate) is explained as an example of the piezoelectric substrate 10, a substrate having another cut surface may be used. Moreover, a piezoelectric substrate composed of other materials may be used. In the case of the rotated Y-cut LiTaO$_3$ substrate, the loss is controlled especially. When a Y-cut angle is equal to or more than 36° and equal to or less than 48°, for example, the bulk radiant quantity becomes the almost same simulation result as FIG. 7. The Y-cut angle can be equal to or more than 38° and equal to or less than 46°, for example.

The rotated Y-cut LiTaO$_3$ substrate having a cut angle from −30° to 90° can be used as the piezoelectric substrate. Especially, in a 41° rotated Y-cut LiTaO$_3$ substrate and a 64° rotated Y-cut LiTaO$_3$ substrate, an electromechanical coupling coefficient is large, and a propagation loss is small. Even if such a piezoelectric substrate is used, the bulk radiant quantity becomes the almost same simulation result as FIG. 7. The metals forming the IDT 11, and a film thickness hardly influence the simulation result of FIG. 7.

It is desirable that the metallization ratio D is equal to or more than 0.3, and it is more desirable that the metallization ratio D is equal to or more than 0.4. This is because a withstand voltage performance of the resonator reduces when the width of the electrode finger becomes narrow. Moreover, it is desirable that the metallization ratio D is equal to or less than 0.7, and it is more desirable that the metallization ratio D is equal to or less than 0.6. This is because, when an interval between the electrode fingers becomes narrow, static electricity is easily generated, and a possibility that the electrostatic discharge damage of the resonator is caused becomes high.

In the case of a filter for high frequency signal whose frequency is 1 GHz or more, it is desirable to use the acoustic wave element according to the first to the fourth embodiments. Especially, when the frequency is 1.7 GHz or more, it is desirable to use the acoustic wave element according to the first to the fourth embodiments. Moreover, from the viewpoint of the process of the electrode fingers, it is desirable that the frequency is equal to or less than 5 GHz.

In the first to the fourth embodiments, the description is given of an example in which the end faces 20 are formed on the two ends of the IDT 11 in the propagation direction of the acoustic wave, but the end face 20 may be formed on at least one end of the IDT 11 in the propagation direction of the acoustic wave.

Although the embodiments of the present invention have been described in detail, it is to be understood that the various change, substitutions, and alterations could be made hereto without departing from the spirit and scope of the invention.

What is claimed is:

1. An acoustic wave element comprising:
   a piezoelectric substrate;
   an IDT (Interdigital Transducer) formed on the piezoelectric substrate; and
   an end face of the piezoelectric substrate that is formed on at least one end of the IDT in a propagation direction of an acoustic wave;
   wherein when a wavelength of the acoustic wave which the IDT excites is expressed by "$\lambda$" and a metallization ratio of the IDT is expressed by "D", a distance between an inner end of an electrode finger of the IDT nearest to the end face and the end face is equal to or more than $7\lambda/16+D\times\lambda/4$ and equal to or less than $3\lambda/4+D\times\lambda/4$, the inner end of the electrode finger of the IDT nearest to the end face being an end furthest from the end face among both ends of the electrode finger of the IDT nearest to the end face,
   wherein a width of the electrode finger of the IDT nearest to the end face is more than $D\times\lambda/2$, and
   wherein when a width of an electrode finger of the IDT other than the electrode finger of the IDT nearest to the end face is expressed by "W12", the metallization ratio D is defined as $(W12\times2)/\lambda$.

2. An acoustic wave element comprising:
   a piezoelectric substrate;
   an IDT (Interdigital Transducer) formed on the piezoelectric substrate; and
   an end face of the piezoelectric substrate that is formed on at least one end of the IDT in a propagation direction of an acoustic wave;
   wherein when a wavelength of the acoustic wave which the IDT excites is expressed by "$\lambda$" and a metallization ratio of the IDT is expressed by "D", a distance between an inner end of an electrode finger of the IDT nearest to the end face and the end face is equal to or less than $\lambda/4+D\times\lambda/4$, and a width of the electrode finger of the IDT nearest to the end face is more than $D\times\lambda/2$, the inner end of the electrode finger of the IDT nearest to the end face being an end furthest from the end face among both ends of the electrode finger of the IDT nearest to the end face, and
   wherein when a width of an electrode finger of the IDT other than the electrode finger of the IDT nearest to the end face is expressed by "W12", the metallization ratio D is defined as $(W12\times2)/\lambda$.

3. The acoustic wave element according to claim 1, wherein the end face is a side surface of a groove formed on the piezoelectric substrate.

4. The acoustic wave element according to claim 2, wherein the end face is a side surface of a groove formed on the piezoelectric substrate.

5. The acoustic wave element according to claim 1, wherein
a side surface near the end face among side surfaces of an electrode finger of the IDT nearest to the end face, and the end face are in the same plane.

6. The acoustic wave element according to claim 2, wherein
a side surface near the end face among side surfaces of an electrode finger of the IDT nearest to the end face, and the end face are in the same plane.

7. The acoustic wave element according to claim 1, wherein
a side surface near the end face among side surfaces of an electrode finger of the IDT nearest to the end face is separated from the end face.

8. The acoustic wave element according to claim 2, wherein
a side surface near the end face among side surfaces of an electrode finger of the IDT nearest to the end face is separated from the end face.

9. The acoustic wave element according to claim 1, wherein
the piezoelectric substrate is a rotated Y-axis cut X-direction propagation lithium tantalate substrate having a Y-axis cut angle from 36 degrees or more to 48 degrees or less.

10. The acoustic wave element according to claim 2, wherein
the piezoelectric substrate is a rotated Y-axis cut X-direction propagation lithium tantalate substrate having a Y-axis cut angle from 36 degrees or more to 48 degrees or less.

11. The acoustic wave element according to claim 1, wherein
the width of the electrode finger of the IDT nearest to the end face is more than $\lambda/2$.

* * * * *